(12) United States Patent
Ryoo

(10) Patent No.: US 9,949,414 B2
(45) Date of Patent: Apr. 17, 2018

(54) COOLING SYSTEM FOR TWO-DIMENSIONAL ARRAY POWER CONVERTERS

(71) Applicant: LSIS CO., LTD., Gyeonggi-do (KR)

(72) Inventor: Seong-Ryoul Ryoo, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/410,596

(22) Filed: Jan. 19, 2017

(65) Prior Publication Data

US 2017/0245403 A1 Aug. 24, 2017

(30) Foreign Application Priority Data

Feb. 18, 2016 (KR) .................. 10-2016-0019152

(51) Int. Cl.
*H05K 7/20* (2006.01)
*F25B 9/04* (2006.01)

(52) U.S. Cl.
CPC .......... *H05K 7/20945* (2013.01); *F25B 9/04* (2013.01); *H05K 7/20918* (2013.01)

(58) Field of Classification Search
CPC ....... F25B 9/04; B01D 17/0217; H01L 35/30; H01L 21/67051; G06F 1/20; G06F 1/206; H05K 7/20736; H05K 13/08; H05K 7/20945; H05K 7/20918
See application file for complete search history.

(56) References Cited

U.S. PATENT DOCUMENTS

| | | | |
|---|---|---|---|
| 5,010,736 A | * | 4/1991 | York .................. F25B 9/04 62/263 |
| 6,108,206 A | | 8/2000 | Criniti et al. |

(Continued)

FOREIGN PATENT DOCUMENTS

| | | |
|---|---|---|
| EP | 1467453 A2 | 10/2004 |
| JP | 03-113893 U1 | 11/1991 |

(Continued)

OTHER PUBLICATIONS

Extended European Search Report dated Jul. 13, 2017 corresponding to application No. 16195244.5-1803.

(Continued)

*Primary Examiner* — Adam B Dravininkas
(74) *Attorney, Agent, or Firm* — K&L Gates LLP

(57) ABSTRACT

Disclosed herein is a cooling system for two-dimensional array power converters. The cooling system includes: a plurality of power converters arranged in two-dimension; a compressor configured to generate compressed air; vortex tubes each installed in the respective power converters, the vortex tubes configured to generate low-temperature air based on compressed air from the compressor; valves installed between the compressor and the vortex tubes; temperature sensors each installed in the respective power converters to measure temperature inside the power converters; and a controller configured to determine whether to supply the low-temperature air into the power converters by using the vortex tubes, based on the temperature measured by the temperature sensors, and to control the valves depending on a result of the determination.

13 Claims, 5 Drawing Sheets

(56) References Cited

U.S. PATENT DOCUMENTS

| | | | | |
|---|---|---|---|---|
| 6,628,520 B2* | 9/2003 | Patel | .................. | H05K 7/20754 165/104.32 |
| 6,990,817 B1* | 1/2006 | Bhatia | ...................... | F25B 9/04 62/259.2 |
| 7,012,807 B2* | 3/2006 | Chu | ......................... | G06F 1/20 165/104.33 |
| 7,751,188 B1* | 7/2010 | French | ............... | H05K 7/20736 165/104.33 |
| 8,051,671 B2* | 11/2011 | Vinson | ............... | H05K 7/20745 62/259.2 |
| 8,665,591 B2* | 3/2014 | Bourgeois | ........... | H01M 10/399 361/679.5 |
| 2007/0247808 A1 | 10/2007 | Behrens et al. | | |
| 2008/0173036 A1* | 7/2008 | Williams | .................. | G06F 1/20 62/259.2 |
| 2009/0159715 A1* | 6/2009 | Lessig | ...................... | F25B 9/04 236/47 |
| 2010/0125377 A1* | 5/2010 | Kim | .................. | G01R 31/2862 700/300 |
| 2010/0226090 A1* | 9/2010 | Gilliland | ............ | H05K 7/20736 361/691 |
| 2011/0173994 A1* | 7/2011 | Chang | ...................... | F25B 9/04 62/5 |
| 2011/0182028 A1* | 7/2011 | Tan | .......................... | G06F 1/20 361/679.46 |

FOREIGN PATENT DOCUMENTS

| | | |
|---|---|---|
| JP | H08316673 A | 11/1996 |
| JP | H11294889 A | 10/1999 |
| JP | 2003179204 A | 6/2003 |
| JP | 2014-117121 A | 6/2014 |
| KR | 10-2004-0046613 A | 6/2004 |
| KR | 10-0726461 B1 | 6/2007 |
| KR | 10-2013-0079763 A | 7/2013 |

OTHER PUBLICATIONS

Japanese Office Action for related Japanese Application No. JP2016-231805; action dated Oct. 3, 2017; (4 pages).

* cited by examiner

COOLING SYSTEM FOR TWO-DIMENSIONAL ARRAY POWER CONVERTERS

CROSS REFERENCE TO RELATED APPLICATION

This application claims the benefit of Korean Patent Application No. 10-2016-0019152, filed on Feb. 18, 2016, entitled "COOLING SYSTEM FOR TWO-DIMENSIONAL ARRAY POWER CONVERTERS", which is hereby incorporated by reference in its entirety into this application.

BACKGROUND

1. Technical Field

The present disclosure relates to a cooling system, and more specifically to a cooling system for two-dimensional array power converters that can stably cool down the power converters arranged in two-dimension by employing vortex tubes.

2. Description of the Related Art

As a power converter used in the industrial field, an apparatus such as an inverter for motor drive, a solar inverter, an energy storage system (ESS) or the like generates heat when it is driven.

Since the heat generated when the power converter is driven causes performance deterioration, reduced life, interruption and the like of the apparatus, there is a consistent need for development of a system for cooling the apparatus efficiently.

Accordingly, a variety of cooling apparatuses for cooling the power converter has been proposed. Cooling apparatuses may be classified into an air blowing type and a water cooling type.

The air blowing type is a method of using a fan to forcedly dissipate heat generated from a power converter, which is also referred to as a forced air cooling technique. The air blowing type is a technique for driving a fan to circulate air between cooling fins so as to maintain the power converter at a proper temperature For a typical power converter, e.g., an inverter, a plurality of cooling fins is disposed at the lower portion therein, and a plurality of fans is disposed on the upper portion of the case.

Heat generated during the operation of the power converter moves toward the upper portion by the fans and exit.

Since power converters are cooled down by the fans using the air blowing technique in the related art, the power converters can be arranged only horizontally in one-dimension, but not vertically in two-dimension. As a result, it is not possible to efficiently utilize the space for installing power converters.

SUMMARY

It is an aspect of the present disclosure to provide a cooling system for two-dimensional array power converters that can stably cool down the power converters arranged in two-dimension by employing vortex tubes.

In accordance with one aspect of the present disclosure, a cooling system including: a plurality of power converters arranged in two-dimension; a compressor configured to generate compressed air; vortex tubes each installed in the respective power converters, the vortex tubes configured to generate low-temperature air based on compressed air from the compressor; valves installed between the compressor and the vortex tubes; temperature sensors each installed in the respective power converters to measure temperature inside the power converters; and a controller configured to determine whether to supply the low-temperature air into the power converters by using the vortex tubes, based on the temperature measured by the temperature sensors, and to control the valves depending on a result of the determination.

The controller may compare the temperature measured by the temperature sensors with a predetermined temperature, and the controller may transmit a signal to open a valve to the valve if the temperature measured by the temperature sensors exceeds the predetermined temperature, and transmits a signal to close a valve to the valve if the temperature measured by the temperature sensors does not exceed the predetermined temperature.

The temperature sensors may include a first temperature sensor installed adjacent to a case of each of the power converters to measure a temperature of the case; and a second temperature sensor installed adjacent to a semiconductor element for power conversion located in each of the power converters to measure a temperature of the semiconductor element.

The controller may transmit a signal to open a valve to the value if the temperature measured by the first temperature sensor exceeds the first predetermined temperature or
if the temperature measured by the second temperature sensor exceeds the second predetermined temperature.

The controller may transmit a signal to close a valve to the value if the temperature measured by the first temperature sensor does not exceed the first predetermined temperature and the temperature measured by the second temperature sensor does not exceed the second predetermined temperature.

The vortex tubes may include a first vortex tube installed close to the case of each of the power converters to supply low-temperature air, and a second vortex tube installed close to the semiconductor elements for power conversion to supply low-temperature air.

The controller may store matching information between the temperature sensors and the valves, determine whether to supply a low-temperature air, select one from among the valves that corresponds to a temperature sensor used in determining whether to supply a low-temperature air based on the matching information, and controls opening/closing of the selected valve.

If the temperature measured by the temperature sensors exceeds a predetermined range, the controller may control a degree to which the valve is opened depending on how much it exceeds the predetermined range.

According to an exemplary embodiment of the present disclosure, by applying a cooling system using a vortex tube for cooling down power converters, it is possible to design fanless power converters.

This allows the power converters to be arranged horizontally and vertically, and thus it is possible to reduce the installation space for the power converters.

In addition, it is possible to reduce cost for fan replacement and reduce costs for maintenance since the vortex tubes are semi-permanent.

In addition, since the case of each of the power converters in the cooling system according to the exemplary embodiments of the present disclosure can be fabricated in a closed type, it is possible to achieve dust-proof capability and explosion-proof capability, thereby allowing applications to a variety of environments.

In addition, since the temperature of the cooling air is low, it is possible to reduce the volume and number of cooling fins, thereby reducing the volume and weight of the power converters.

Further, since the case of each of the power converters can be fabricated in a closed type and fan-less form, it is possible to improve noise-proof capability, thereby allowing a design of low-noise power converters.

DETAILED DESCRIPTION

Figure 1:
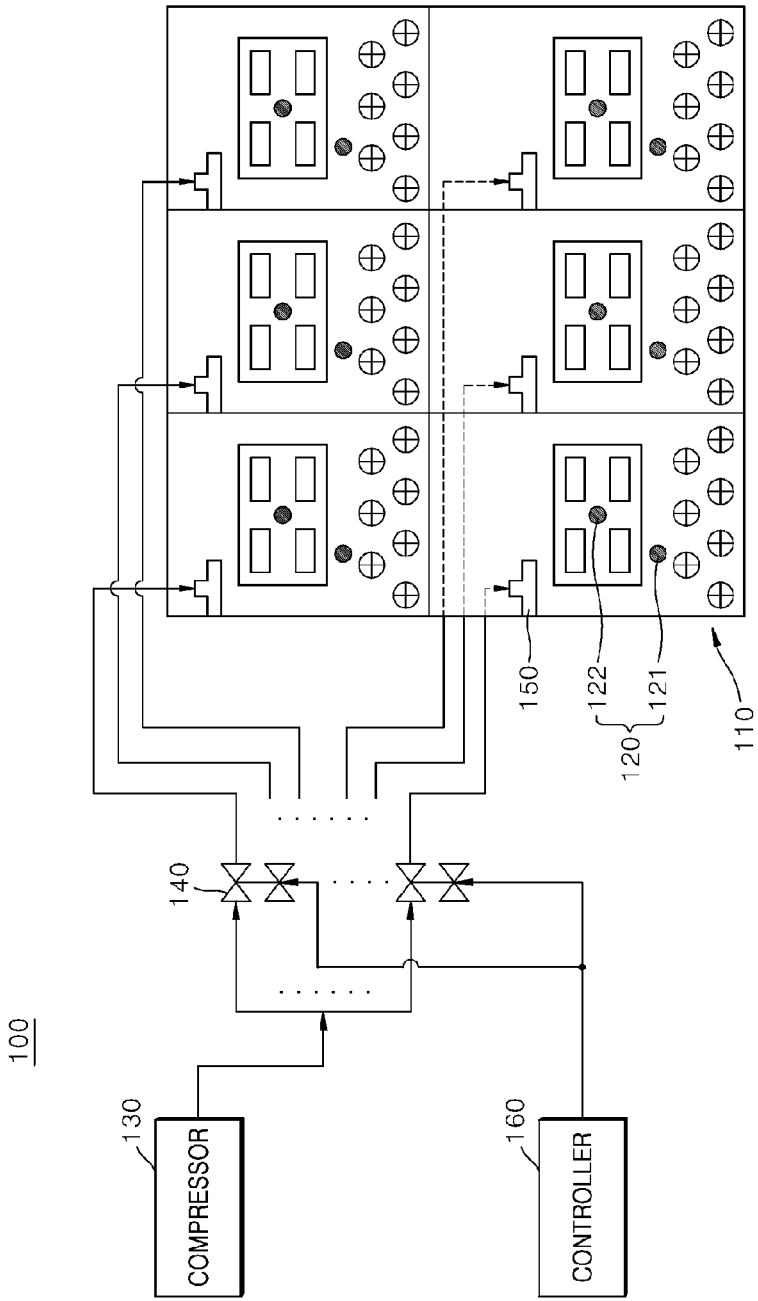
FIG. 1 is a diagram showing a configuration of a cooling system for two-dimensional array power converters according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined solely by the claims. Like reference numerals denote like elements throughout the descriptions.

Detailed descriptions of well-known functions and structures incorporated herein will be omitted to avoid obscuring the subject matter of the present disclosure. Further, terms or words used in the specification and claims shall not be construed merely in a conventional and dictionary definition but shall be construed in a meaning and concept corresponding to the technical idea of the present invention based on the principle that an inventor is allowed to properly define the concepts of terms in order to describe his or her invention in the best way. Therefore, the terms, such as those defined in commonly used dictionaries, should be interpreted as having a meaning that is consistent with their meaning in the context of the relevant art and/or the present application.

Hereinafter, the configuration and operation of a cooling system for two-dimensional array power converters according to an exemplary embodiment of the present disclosure will be described in detail with reference to the accompanying drawings.

FIG. 1 is a diagram showing the configuration of a cooling system for two-dimensional array power converters according to a first exemplary embodiment of the present disclosure.

Figure 2:
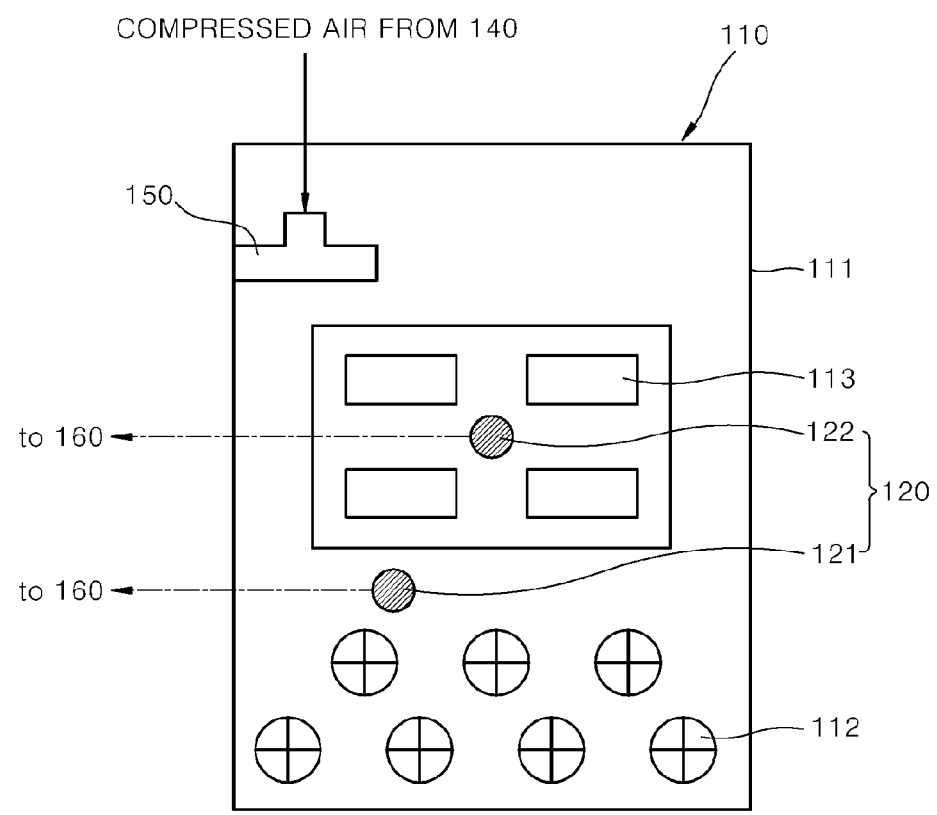
FIG. 2 is a diagram showing an inner configuration of a power converter employed in a cooling system for two-dimensional array power converters according to an exemplary embodiment of the present disclosure.

FIG. 2 is a diagram showing the inner configuration of a power converter employed in the cooling system for two-dimensional array power converters according to the first exemplary embodiment of the present disclosure.

Referring to FIGS. 1 and 2, a cooling system 100 for two-dimensional array power converters according to the first exemplary embodiment (hereinafter referred to as "the cooling system") includes a plurality of power converters 110 arranged in two-dimension, temperature sensors 120, a compressor 130, valves 140, vortex tubes 150 and a controller 160. It is to be noted that the configuration of the cooling system 100 is not limited to those shown in FIGS. 1 and 2.

The cooling system 100 according to the exemplary embodiment of the present disclosure includes the power converters 110, which are arranged in two-dimension. In this exemplary embodiment of the present disclosure, six power converters 110 are arranged in a 2-by-3 layout. It is to be understood that the power converters may be arranged in different layouts.

The power converters 110 are apparatuses that convert the form of power as desired. For example, it may convert the current, voltage, frequency or the like of power. For example, the power converters 110 may be inverters for motor drive, solar inverters, ESSs, converters or the like.

Each of the power converters 110 includes cooling fins 112 installed in the case 111 and semiconductor elements 113 for power conversion. The case 111 is of a closed type.

In the related art, power converters are of an open type since they include fans. In contrast, the power converters 110 according to the exemplary embodiment of the present disclosure are fabricated as the closed type.

For example, the cooling fins 112 may be disposed at the lowest part of each of the power converters 110 and the semiconductor elements 113 may be disposed above the cooling fins 112.

In addition, a plurality of semiconductor elements 113 for power conversion, four semiconductor elements 113 in this exemplary embodiment may be disposed in each of the power converters 110. It is to be noted that the number of the semiconductor elements 113 in each of the power converters 110 may vary.

The temperature sensors 120 are installed in each of the power converters 110 and measure the temperature inside the power converters 110 to provide it to the controller 160.

The temperature sensors 120 may include a first temperature sensor 121 installed adjacent to the case 111 to measure the temperature inside the power converters 110, and a second temperature sensor 122 installed adjacent to the semiconductor elements 113 for power conversion.

In particular, the first temperature sensor 121 may be installed in the case 111 of each of the power converters 110 to measure the temperature of the case 111. The second temperature sensor 122 may be installed adjacent to the semiconductor elements 113 for power conversion to measure the temperature of the semiconductor elements 113 for power conversion.

The compressor 130 is to supply compressed air to vortex tubes 150. The temperature of a low-temperature air and a high-temperature air generated from the vortex tubes 150 may vary depending on the temperature and the pressure of the compressed air.

Accordingly, the temperature and the pressure of the compressed air supplied by the compressor 130 may be determined appropriately depending on the use and installation environment of the cooling system 100.

For example, the compressor 130 may include a pump generating compressed air, and a pressure tank storing the compressed air generated by the pump.

The valves 140 are installed between the compressor 130 and the vortex tubes 150 and are opened or closed under the control of the controller 160 to control the flow of the compressed air.

Specifically, the valves 140 are opened under control of the controller 160 to allow the compressed air supplied from the compressor 130 to be supplied to the vortex tubes 150. Or, the valves 140 are closed under control of the controller 160 to block the compressed air supplied from the compressor 130 from being supplied to the vortex tubes 150.

The compressor 130 is connected to the vortex tubes 150 via pipes. The valves 140 may be disposed on the pipes.

If there is only one valve, the compressed air is supplied to all of the vortex tubes 150 via the valve, and thus the compressed air may be supplied even to a vortex tube of a power converter which need not to be cooled down.

Accordingly, it is desired that the number of the valves is equal to the number of the vortex tubes 150 disposed in the power converters 110.

In addition, a plurality of pipes is disposed to connect the plurality of valves 140 to the plurality of vortex tubes 150.

The vortex tubes 150, which are also referred to as Ranque-Hilsch vortex tubes, separate the compressed air supplied from the compressor 130 into high-temperature air and low-temperature air.

In the cooling system 100 according to the exemplary embodiment of the present disclosure, one vortex tube is disposed in every power converter. However, this is merely illustrative.

Details on the shape and design of the vortex tubes 150 are well known in the art, and any of the known vortex tubes may be selected appropriately by those skilled in the art depending on the use purpose and installation environment.

The low-temperature air generated from the vortex tubes 150 is supplied into the power converters 110 to lower the temperature of the power converters 110.

In particular, each of the vortex tubes 150 is disposed on a location that is appropriate to lower the temperature of the case 111 of the power converters 110 and the semiconductor elements 113.

Although one vortex tube 150 is disposed in every power converter 110 in this exemplary embodiment of the present disclosure, more than one vortex tubes 150 may be disposed in every power converter 110.

Figure 3:
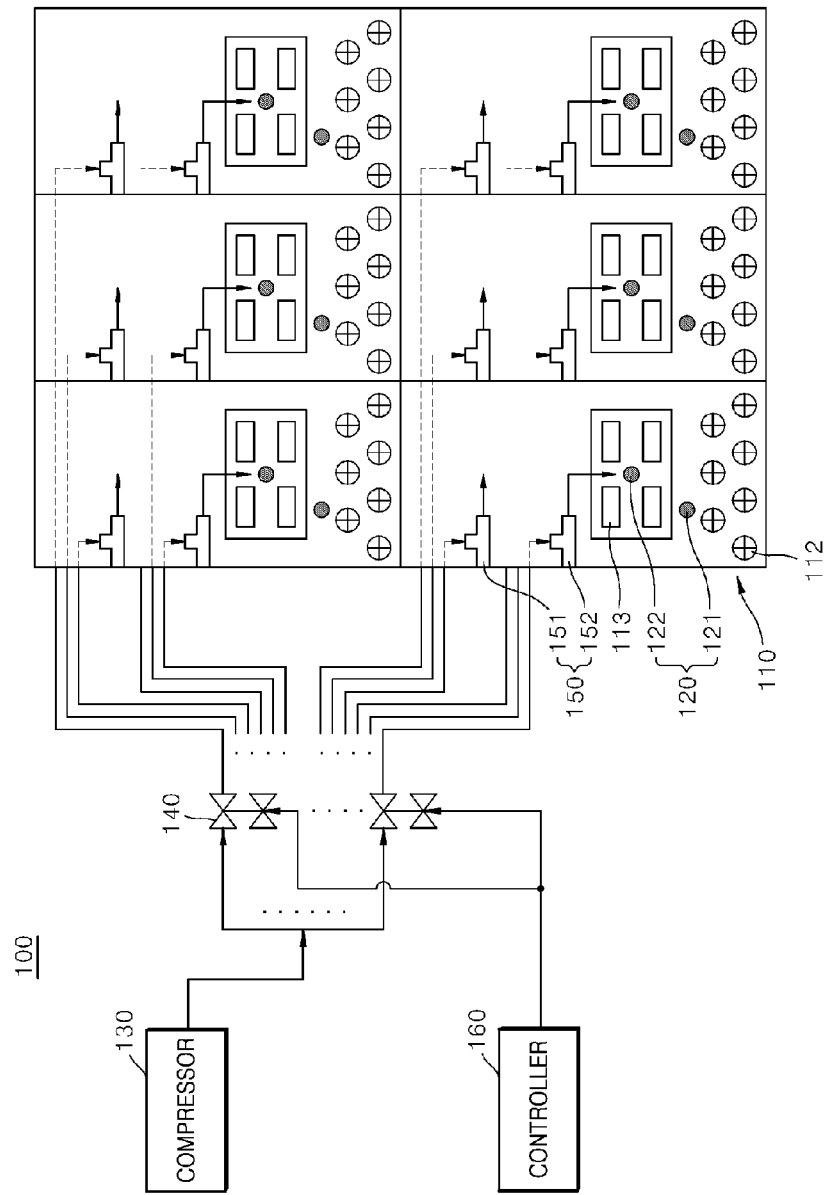
FIG. 3 is a diagram showing a variant of a cooling system for two-dimensional array power converters according to an exemplary embodiment of the present disclosure.

FIG. 3 is a diagram showing a variant of a cooling system for two-dimensional array power converters according to an exemplary embodiment of the present disclosure.

Referring to FIG. 3, each of the power converters 110 may include a plurality of vortex tubes 150. The identical elements with those of the cooling system for two-dimensional array power converters shown in FIGS. 1 and 2 will not be described again.

In FIG. 3, each of the power converts 110 includes two vortex tubes 150. However, this is merely illustrative. For example, each of the power converts 1110 may include three or more vortex tubes. In the following description, it is assumed that each of the power converts 110 includes two vortex tubes 150.

The two vortex tubes 150 may include a first vortex tube 151 and a second vortex tube 152. The first vortex tube 150 may be installed such that low-temperature air generated from the first vortex tube 151 flows toward the case 111. The second vortex tube 152 may be installed close to the semiconductor elements 113 for power conversion so that the temperature of the semiconductor elements 113 is lowered. The number of the valves 140, of course, is increased as the number of the vortex tubes 150 increases.

The controller 160 receives the temperature measured by the temperature sensors 120 and determines whether to supply low temperature air to the power converters 110 by using the vortex tubes 150 based on the received temperature.

That is, the controller 160 compares the temperature measured by a first temperature sensor 121 (hereinafter referred to as a first temperature) with a first predetermined temperature. The first predetermined temperature refers to an appropriate temperature of the case 111 of each of the power converters and may have a certain range.

If the first temperature exceeds the first predetermined temperature, the controller 160 determines that low-temperature air has to be supplied to the power converters 110 by using the first vortex tube 151.

In addition, the controller 160 compares the temperature measured by a second temperature sensor 122 (hereinafter referred to as a second temperature) with a second predetermined temperature. The second predetermined temperature refers to an appropriate temperature of the semiconductor elements 113 of each of the power converters and may have a certain range.

If the second temperature exceeds the second predetermined temperature, the controller 160 determines that low-temperature air has to be supplied to the power converters 110 by using the second vortex tube 152.

The first and second predetermined temperatures may be determined by those skilled in the art taking into account a system employing them, an installation environment, and the like. For example, the first predetermined temperature may be set between 80° C. and 100° C., and the second predetermined temperature may be set between 100° C. and 120° C.

The controller 160 controls the valves 140 individually as to whether to supply low-temperature air or not, which is determined based on the temperature measured by the temperature sensors 120 installed in each of the power converters 110.

That is, the controller 160 stores matching information between the temperature sensors 120 and the valves 140 and determines whether to supply low-temperature air based on the temperature measured by the temperature sensors 120. The controller 160 controls one of the valves 140 that is matched with a temperature sensor 120 used in determining whether to supply low-temperature air by referring to the matching information based on the determination.

If it is determined that low-temperature air has to be supplied to a power converter 110 by using the vortex tubes 150, the controller 160 transmits a signal to open a valve to the valve 140.

Accordingly, the valves 140 are opened as they receive a signal to open a valve from the controller 160, and the compressed air supplied from the compressor is supplied to the vortex tubes 150 via the valves 140.

The rate of the low-temperature air supplied by the vortex tubes 150 may be adjusted by the valves. If it is determined that the temperature sensed by the temperature sensors 120 is higher than a predetermined temperature range and thus the valves 140 has to be opened, the controller 160 may adjust the rate by controlling the degree to which valves 140 is opened. The rate of the introduced air may be set in advance depending on how much the temperature sensed by the temperature sensors 120 exceeds the predetermined temperature. For example, the rate when the temperature sensed by the temperature sensor 120 exceeds a predetermined temperature by 1° C. to 10° C., and the rate when the temperature sensed by the temperature sensor 120 exceeds the predetermined temperature by 11° C. to 20° C. may be set in advance. The controller 160 controls the valves 140 so that the compressed air is introduced at a desired rate depending on how much the temperature sensed by the temperature sensor 120 exceeds the predetermined temperature.

On the other hand, if the temperature measured by the first temperature sensor 121 does not exceed the first predetermined temperature (below the first predetermined temperature), the controller 160 determines that it is not necessary to supply low temperature to the power converters 110 by using the first vortex tube 151.

In addition, if the temperature measured by the second temperature sensor 122 does not exceed the second predetermined temperature (below the second predetermined temperature), the controller 160 determines that it is not necessary to supply low temperature to the power converters 110 by using the second vortex tube 152.

If it is determined that it is not necessary to supply low-temperature air to the power converters 110 by using the vortex tubes 150, the controller 160 transmits a signal to close a valve to the valves 140.

Accordingly, the valves 140 are closed as they receive the signal to close a valve from the controller 160, and the compressed air supplied from the compressor is blocked by the valves 140 and is not supplied to the vortex tubes 150.

In this exemplary embodiment of the present disclosure, the controller 160 determines whether to supply low-temperature air to the power converters 110 by using the vortex tubes 150 based on the temperatures measured by the first and second temperature sensors 121 and 122.

However, it will be understood that an exemplary embodiment of the present disclosure may be practiced with only one of the first and second temperature sensors 121 and 122.

Specifically, if the cooling system 100 includes the first temperature sensor 121 only, the controller 160 determines whether to supply the low-temperature air to the power converters 110 by using the vortex tubes 150 based only on the temperature measured by the first temperature sensor 121.

Likewise, if the cooling system 100 includes the second temperature sensor 122 only, the controller 160 determines whether to supply the low-temperature air to the power converters 110 by using the vortex tubes 150 based only on the temperature measured by the second temperature sensor 122.

Accordingly, when the power converters 110 are cooled down by the cooling system using the vortex tubes 150, the power converters 110 do not require fans. This allows the power converters 110 to be arranged horizontally and vertically, and thus it is possible to reduce the installation space for the power converters.

That is, in the related art, it is not possible to arrange the power converts vertically due to the flow of the air generated by the fans. As the fans are driven, the air introduced from the lower part of the power converter exits through the upper part thereof, and thus it is not possible to dispose another power converter above the power converter.

In contrast, as the cooling system for two-dimensional array power converters according to the exemplary embodiment of the present disclosure includes no fan, the power converters may be arranged in two-dimension.

In the foregoing description, the configuration of the cooling system for two-dimensional array power converters according to the exemplary embodiment of the present disclosure has been described. Hereinafter, an operation of the cooling system for two-dimensional array power converters will be described in detail with reference to the accompanying drawings.

Figure 4:
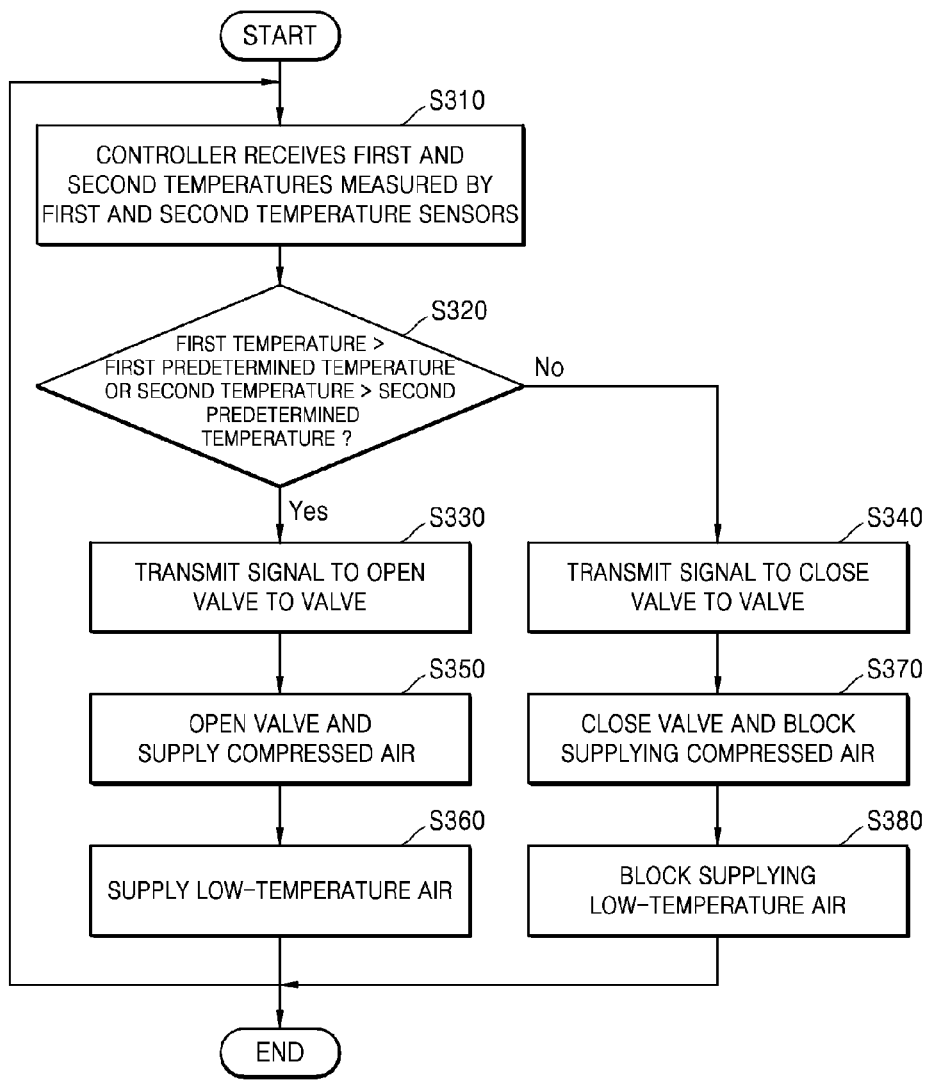
FIG. 4 is a flowchart for illustrating an operation sequence of a cooling system for two-dimensional array power converters according to an exemplary embodiment of the present disclosure.

FIG. 4 is a flowchart for illustrating an operation sequence of the cooling system for two-dimensional array power converters according to an exemplary embodiment of the present disclosure.

The operation of the cooling system for two-dimensional array power converters according to the exemplary embodiment of the present disclosure will be described with reference to FIG. 4. It is assumed that the cooling system 100 is driven, and the temperature sensors 120 and the compressor 130 are operating normally. In addition, it is assumed that the temperature sensors 120 include first and second temperature sensors 121 and 122. It is assumed that the first temperature sensor 121 is disposed adjacent to the cooling fins 112 and the second temperature sensor 122 is disposed adjacent to the semiconductor elements 113.

Referring to FIG. 4, the controller 160 receives first and second temperatures measured by the first and second temperature sensors 121 and 122, respectively (step S310). The controller 160 compares the received first and second temperatures with the first and second predetermined temperatures to determine whether the first and second temperatures exceed the first and second predetermined temperatures, respectively (step S320).

If it is determined that the received first temperature exceeds the first predetermined temperature or the second temperature exceeds the second predetermined temperature (Yes in step S320), the controller 160 transmits a signal to open a valve to the valves 140 (step S330). If it is determined that the received first temperature does not exceed the first predetermined temperature and the second temperature does not exceed the second predetermined temperature (No in step S320), the controller 160 transmits a signal to close a valve to the valves 140 (step S340).

Once the valves 140 receive the signal to open a valve in step S330, a valve 140 is opened such that the compressed air is supplied to the vortex tubes 150 (step S350), and the vortex tubes 150 supply low-temperature air to the respective power converter 110 (step S360).

On the other hand, once the valves 140 receive the signal to close a valve in step S340, a valve 140 is closed such that the compressed air is blocked and is not supplied to the vortex tubes 150 (step S370), and the vortex tubes 150 do not supply low-temperature air to the respective power converter 110 (step S380).

When the signal to open a valve is transmitted in step S300 or the signal to close a valve is transmitted in step S340, the controller 160 transmits the signal to open a valve or the signal to close a valve to the valve matched with the temperature sensor 120 that has transmitted the first temperature or the second temperature.

The controller 160 may select a valve 140 matched with the temperature sensor 120 based on the matching information between the temperature sensors 120 and the valves 140.

Figure 5:
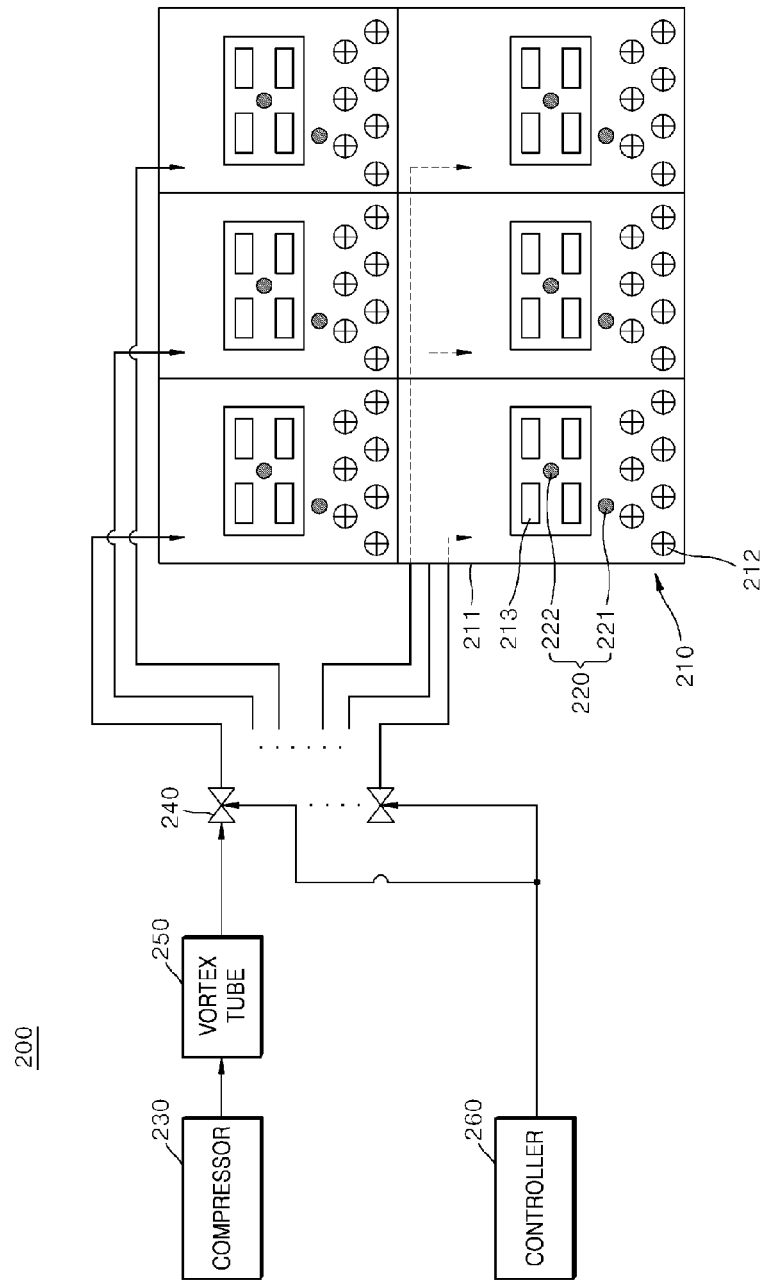
FIG. 5 is a diagram showing a configuration of a cooling system for two-dimensional array power converters according to another exemplary embodiment of the present disclosure.

FIG. 5 is a diagram showing a configuration of a cooling system for two-dimensional array power converters according to a second exemplary embodiment of the present disclosure.

Referring to FIG. 5, a cooling system 200 for two-dimensional array power converters according to the second exemplary embodiment includes a plurality of power converters 210 arranged in two-dimension, temperature sensors 220, a compressor 230, valves 240, a vortex tube 250 and a controller 260. It is to be noted that the configuration of the cooling system 200 is not limited to that shown in FIG. 5.

According to the first exemplary embodiment, each of the plurality of power converters includes at least one vortex tube. In contrast, according to the second exemplary embodiment, one vortex tube 250 is installed outside a plurality of power converters and a plurality of valves 240 is disposed between vortex tube 250 and the plurality of power converters 210.

The cooling system 200 includes the plurality of power converters 210, which are arranged in two-dimension. In this exemplary embodiment of the present disclosure, six power converters 210 are arranged in a 2-by-3 layout. However, it is to be understood that the power converters may be arranged in different layouts.

The power converters 210 are apparatuses that convert the form of power as desired. For example, it may convert the current, voltage, frequency or the like of power. For example, the power converters 210 may be inverters for motor drive, solar inverters, ESSs, converters or the like.

Each of the power converters 210 includes cooling fins 211 installed in the case 212 and semiconductor elements 213 for power conversion. The case 211 is of a closed type.

In the related art, power converters are of an open type since they include fans. In contrast, the power converters 210 according to the exemplary embodiment of the present disclosure are fabricated as the closed type.

For example, the cooling fins 212 may be disposed at the lowest part of each of the power converters 210 and the semiconductor elements 213 may be disposed above the cooling fins 212.

In addition, a plurality of semiconductor elements 213 for power conversion, four semiconductor elements 113 in this exemplary embodiment may be disposed in each of the power converters 210. It is to be noted that the number of the semiconductor elements 213 in each of the power converters 210 may vary.

The temperature sensors 220 are installed in each of the power converters 210 and measure the temperature inside the power converters 210 to provide it to the controller 260.

The temperature sensors 220 may include a first temperature sensor 221 installed adjacent to the case 210 to measure the temperature inside the power converters 211, and a second temperature sensor 222 installed adjacent to the semiconductor elements 213 for power conversion.

In particular, the first temperature sensor 221 may be installed in the case 211 of each of the power converters 210 to measure the temperature of the case 211. The second temperature sensor 222 may be installed adjacent to the semiconductor elements 213 for power conversion to measure the temperature of the semiconductor elements 213 for power conversion.

The compressor 230 is to supply compressed air to vortex tubes 250. The temperature of a low-temperature air and a high-temperature air generated from the vortex tubes 250 may vary depending on the temperature and the pressure of the compressed air.

Accordingly, the temperature and the pressure of the compressed air supplied by the compressor 230 may be determined appropriately depending on the use and installation environment of the cooling system 200.

The compressor 230 may include, but is not limited to, a pump generating a compressed air, and a pressure tank storing the compressed air generated by the pump.

The valves 240 are installed between the vortex tube 250 and the plurality of power converters and are opened or closed under the control of the controller 260 to control the flow of the compressed air.

Specifically, the valves 240 are opened under control of the controller 260 to allow the low-temperature air supplied from the vortex tube 250 to be supplied to each of the power converters 210. Or, the valves 240 are closed under control of the controller 260 to block the low-temperature air supplied from the vortex tube 250 from being supplied to each of the power converters 210.

The compressor 230, the vortex tube 250 and the power converters are connected to one another via pipes. The valves 240 may be disposed on the pipes. The number of the valves 240 is equal to that of the power converters 210.

The vortex tube 250 separates the compressed air supplied from the compressor 230 into high-temperature air and low-temperature air.

The low-temperature air generated in the vortex tube 250 is supplied into the power converters 210 via pipes. The outlet of each of the pipes is disposed at a location appropriate for lowering the temperatures of the case 211 and the semiconductor elements 213. That is, the outlet may be disposed adjacent to the case 211 or the semiconductor elements 213.

According to the exemplary embodiment of the present disclosure, by applying a cooling system using a vortex tube for cooling down power converters, it is possible to design fanless power converters.

This allows the power converters to be arranged horizontally and vertically, and thus it is possible to reduce the installation space for the power converters.

In addition, it is possible to reduce cost for fan replacement and reduce costs for maintenance since the vortex tubes are semi-permanent.

In addition, since the case of each of the power converters in the cooling system according to the exemplary embodiments of the present disclosure can be fabricated in a closed type, it is possible to achieve dust-proof capability and explosion-proof capability, thereby allowing applications to a variety of environments.

In addition, since the temperature of the cooling air is low, it is possible to reduce the volume and number of cooling fins, thereby reducing the volume and weight of the power converters.

Further, since the case of each of the power converters can be fabricated in a closed type and fan-less form, it is possible to improve noise-proof capability, thereby allowing a design of low-noise power converters.

While the exemplary embodiments of the present disclosure have been described with respect to a cooling system for two-dimensional arranged power converters, the scope of the present disclosure is not limited to the exemplary embodiments. It will be understood by those skilled in the art that various changes, alternative and modifications are possible without departing from the spirit and scope of the present disclosure Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. A cooling system for two-dimensional array power converters comprising:
a plurality of power converters arranged in two dimensions;
a compressor configured to generate compressed air;

vortex tubes each installed in the respective power converters, the vortex tubes configured to generate low-temperature air based on the compressed air from the compressor;
valves installed between the compressor and the vortex tubes;
a first temperature sensor installed adjacent to a case of each of the power converters to measure a temperature of the case;
a second temperature sensor installed adjacent to a semiconductor element for power conversion located in each of the power converters to measure a temperature of the semiconductor element; and
a controller configured to determine whether to supply the low-temperature air into the power converters by using the vortex tubes, based on the temperature measured by the temperature sensors, and to control the valves depending on a result of the determination.

2. The cooling system of claim 1,
wherein the controller compares the temperature measured by the temperature sensors with a predetermined temperature,
the controller transmits a signal to open a valve to the valve if the temperature measured by the temperature sensors exceeds the predetermined temperature, and
the controller transmits a signal to close a valve to the valve if the temperature measured by the temperature sensors does not exceed the predetermined temperature.

3. The cooling system of claim 2,
wherein the controller controls the valves so that a degree to which a valve is opened is adjusted depending on how much the temperature measured by the temperature sensors exceeds the predetermined temperature, if the temperature measured by the temperature sensors exceeds the predetermined temperature.

4. The cooling system of claim 1,
wherein the controller sets in advance a first predetermined temperature to an appropriate temperature for the case and a second predetermined temperature to an appropriate temperature for the semiconductor element, and
the controller transmits a signal to open a valve to the valve if the temperature measured by the first temperature sensor exceeds the first predetermined temperature or if the temperature measured by the second temperature sensor exceeds the second predetermined temperature.

5. The cooling system of claim 1,
wherein the controller sets in advance a first predetermined temperature to an appropriate temperature for the case and a second predetermined temperature to an appropriate temperature for the semiconductor element, and
the controller transmits a signal to close a valve to the valve if the temperature measured by the first temperature sensor does not exceed the first predetermined temperature and the temperature measured by the second temperature sensor does not exceed the second predetermined temperature.

6. The cooling system of claim 1, wherein the vortex tubes comprise
a first vortex tube installed close to the case of each of the power converter and configured to supply a low-temperature air, and
a second vortex tube installed close to the semiconductor element of each of the power converters and configured to supply a low-temperature air.

7. The cooling system of claim 1,
wherein the controller stores matching information between the temperature sensors and the valves, determines whether to supply a low-temperature air, selects one from among the valves that corresponds to a temperature sensor used in determining whether to supply a low-temperature air based on the matching information, and controls opening/closing of the selected valve.

8. A cooling system for two-dimensional array power converters comprising:
a plurality of power converters arranged in two dimensions;
a compressor configured to generate compressed air;
a vortex tube configured to generate low-temperature air based on the compressed air from the compressor;
a plurality of valves each installed between the vortex tube and the respective power converters to introduce the low-temperature air generated from the vortex tube into the respective power converters, the number of the power converters being equal to the number of the valves;
a first temperature sensor installed adjacent to a case of each of the power converters to measure a temperature of the case;
a second temperature sensor installed adjacent to a semiconductor element for power conversion located in each of the power converters to measure a temperature of the semiconductor element; and
a controller configured to determine whether to supply the low-temperature air into the power converters by using the vortex tube, based on the temperature measured by the temperature sensors, and to control a valve depending on a result of the determination.

9. The cooling system of claim 8,
wherein the controller compares the temperature measured by the temperature sensors with a predetermined temperature,
the controller transmits a signal to open a valve to the valve if the temperature measured by the temperature sensors exceeds the predetermined temperature, and
the controller transmits a signal to close a valve to the valve if the temperature measured by the temperature sensors does not exceed the predetermined temperature.

10. The cooling system of claim 9,
wherein the controller controls the valves so that a degree to which a valve is opened is adjusted depending on how much the temperature measured by the temperature sensors exceeds the predetermined temperature, if the temperature measured by the temperature sensors exceeds the predetermined temperature.

11. The cooling system of claim 8,
wherein the controller sets in advance a first predetermined temperature to an appropriate temperature for the case and a second predetermined temperature to an appropriate temperature for the semiconductor element, and
the controller transmits a signal to open a valve to the valve if the temperature measured by the first temperature sensor exceeds the first predetermined temperature or if the temperature measured by the second temperature sensor exceeds the second predetermined temperature.

12. The cooling system of claim 8,
wherein the controller sets in advance a first predetermined temperature to an appropriate temperature for the case and a second predetermined temperature to an appropriate temperature for the semiconductor element, and the controller transmits a signal to close a valve to the valve if the temperature measured by the first temperature sensor does not exceed the first predetermined temperature and the temperature measured by the second temperature sensor does not exceed the second predetermined temperature.

13. The cooling system of claim 8,
wherein the controller stores matching information between the temperature sensors and the valves, determines whether to supply a low-temperature air, selects one from among the valves that corresponds to a temperature sensor used in determining whether to supply a low-temperature air based on the matching information, and controls opening/closing of the selected valve.

\* \* \* \* \*